United States Patent [19]

Pigott

[11] Patent Number: 5,057,707
[45] Date of Patent: Oct. 15, 1991

[54] CHARGE PUMP INCLUDING FEEDBACK CIRCUITRY FOR ELIMINATING THE REQUIREMENT OF A SEPARATE OSCILLATOR

[75] Inventor: John M. Pigott, Phoenix, Ariz.

[73] Assignee: Motorola, Inc., Schaumburg, Ill.

[21] Appl. No.: 375,791

[22] Filed: Jul. 5, 1989

[51] Int. Cl.[5] .................... H03K 3/01; H03K 5/153; H03K 3/26; G06G 7/12
[52] U.S. Cl. ........................ 307/296.1; 307/296.6; 307/296.7; 307/359; 307/494; 331/111; 328/127
[58] Field of Search ............ 307/296.1, 296.3, 296.7, 307/270, 358, 359, 362, 442, 318; 331/111; 328/127

[56] References Cited

U.S. PATENT DOCUMENTS

| | | | |
|---|---|---|---|
| 3,656,000 | 4/1972 | Neathery, Jr. | 328/127 |
| 4,607,238 | 8/1986 | Kohsiek | 331/111 |
| 4,716,302 | 12/1987 | Flannagan et al. | 307/296.5 |
| 4,796,174 | 1/1989 | Nadd | 307/296.1 |

FOREIGN PATENT DOCUMENTS 0090139  7/1980  Japan .................. 307/296.2

Primary Examiner—John S. Heyman
Assistant Examiner—Trong Phan
Attorney, Agent, or Firm—Robert D. Atkins

[57] ABSTRACT

A charge pump includes a feedback circuit coupled between the input and output of a driving buffer the latter of which sinks and sources current through a pump capacitor during respective charge and discharge phases. First and second switching diodes are serially coupled between a source of operating potential and an output terminal to isolate each from the other. The pump capacitor alternately sinks current through the first switching diode during the charge phase and sources current though the second switching diode during the dischrge phase. A dynamic voltage is developed at the output of the buffer encompassing first and second predetermined voltage levels corresponding to completion of the charge and discharge phases of the pump capacitor accordingly. The feedback circuit, responsive to the dynamic voltage, complements the drive direction of a buffer to substantially eliminating the timing mismatches between the feedback circuit and the charging rate of the pump capacitor.

18 Claims, 4 Drawing Sheets

5,057,707

CHARGE PUMP INCLUDING FEEDBACK CIRCUITRY FOR ELIMINATING THE REQUIREMENT OF A SEPARATE OSCILLATOR

BACKGROUND OF THE INVENTION

The present invention relates in general to charge pumps, and more particularly, to a charge pump comprising a feedback circuit which does not require a separate oscillator.

Many of today's integrated circuits (ICs) require multiple internal power supply voltages to perform specific functions. In one example, an RS232 communication IC employs both 5 volt and 10 volt supplies to translate the standard 5 volt signals to 10 volt signals prior to transmission. In another example, an MOS $E^2$PROM IC (Metal Oxide Semiconductor Electrically Erasable And Programmable Read Only Memory) uses a single 5 volt power supply for performing standard read operations; however, to execute a write cycle, the gate of a memory cell transistor requires a second power supply voltage, typically 20 volts. More common than not, as described in the preceding examples, the magnitude of the secondary supply voltage is greater than the primary supply voltage and, thus, the former is not readily obtainable from the latter. Furthermore, it is generally not cost effective to allocate an IC pin and apply an external supply voltage thereto just to satisfy an isolated circuit requirement. Hence, such ICs as described above typically incorporate a charge pump for internally generating the secondary voltage from the externally applied primary supply voltage to perform the specific functions.

A conventional charge pump typically comprises a fixed frequency oscillator operating open-loop and coupled to a buffer the latter of which sources and sinks current through a pump capacitor in response to high and low signals from the oscillator. First and second switching diodes are serially coupled between a voltage supply, $V_{CC}$, and the output terminal. The pump capacitor is also coupled to the interconnection of first and second switching diodes. A load and filter capacitor are coupled to the output of the charge pump at the cathode of the second switching diode.

The energy transfer cycle of the conventional charge pump comprises two distinct phases; a charge phase and a discharge phase. During the charge phase the output signal of the oscillator is low causing the buffer to sink current from $V_{CC}$ through the first switching diode thereby storing energy in the pump capacitor. The second switching diode is reversed biased during the charge phase, therefore, the load consumes a portion of the energy stored in the filter capacitor decaying the output voltage. The buffer continues to sink current building the energy level of the pump capacitor to a maximum level until the output signal of the oscillator switches high commencing the discharge phase whereupon the buffer sources current through the pump capacitor and second switching diode thereby transferring energy from the pump capacitor to the filter capacitor and load. The first switching diode is reversed biased during the discharge phase isolating $V_{CC}$ from the load. The buffer continues to source current until the output signal of the oscillator again changes state completing the energy transfer cycle. Assuming that the load consumes less energy than the energy transfer capacity of the charge pump, the output voltage is theoretically maintained at a load dependent level approaching twice $V_{CC}$ minus the potentials across the first and second switching diodes.

In practice, the conventional charge pump is sensitive to the openloop timing mismatches between the period of the oscillator and the charging rate of the pump capacitor, the latter being dependent upon the current drive capacity of the buffer, the value of the pump capacitor and the often dynamic and difficult to predict loading conditions. If the time allocated to the charging cycle is too long, i.e., the frequency of the oscillator is too low, or the duty cycle too large, the pump capacitor charges to its maximum value followed by a dead period waiting for the oscillator to change state. The dead period may cause excessive discharge of the filter capacitor often resulting in unacceptable output voltage droops. For the case when the period of the oscillator is too short, the buffer does not have sufficient time to charge the pump capacitor to its peak value, thus, the average output voltage may decrease reducing the power available to the load. Ideally, the durations of the two states of the oscillator are equal to the times required for charging and discharging the pump capacitor.

Hence, there is a need for an improved charge pump with feedback such that the drive direction of the buffer is reversed upon sensing the completion of each charge and discharge phase substantially eliminating the timing mismatches of the frequency and duty cycle between the oscillator and pump capacitor and increasing the power available to the load.

SUMMARY OF THE INVENTION

It is therefore an objective of the present invention to provide an improved charge pump.

Another objective of the present invention is to provide an improved charge pump including a feedback circuit.

Yet another objective of the present invention is to provide an improved charge pump including feedback circuitry for eliminating the requirement of a separate oscillator.

A further objective of the present invention is to provide an improved charge pump wherein the feedback circuit alternates the drive direction of the buffer upon sensing first and second predetermined thresholds of the output signal thereof.

Still a further objective is to provide an improved charge pump wherein the first and second predetermined thresholds correspond to the completion of the charge and discharge phases.

In accordance with the above and other objectives there is provided a charge pump comprising first and second switching diodes serially coupled between a source of operating potential and an output terminal. A capacitor includes a first terminal coupled between the first and second switching diodes, and a second terminal coupled to the output of a buffer at which a dynamic signal is developed. A feedback circuit is coupled between the input and output of the buffer for alternating the drive direction thereof in response to first and second predetermined levels of the dynamic signal substantially eliminating the timing mismatches of the frequency and duty cycle between the alternating feedback circuit and pump capacitor.

DETAILED DESCRIPTION OF THE PREFERRED EMBODIMENT

Figure 1:
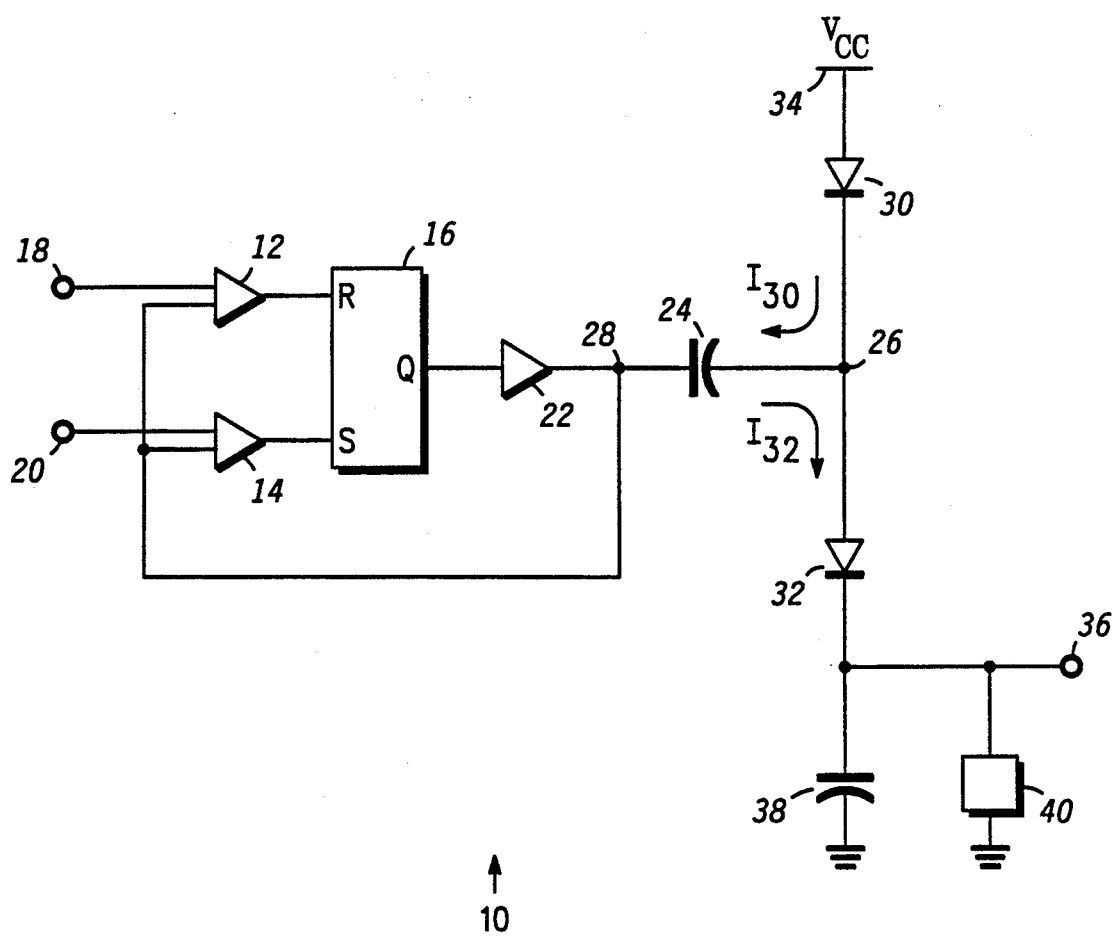
FIG. 1 is a simplified schematic and block diagram illustrating the preferred embodiment of the present invention.

Referring to FIG. 1, charge pump 10 is illustrated which is suited to be manufactured in monolithic integrated circuit form using conventional integrated circuit processes. Charge pump 10 includes comparators 12 and 14 each having first and second inputs, and an output separately coupled to bistable circuit 16. The first inputs of comparators 12 and 14 are coupled to inputs 18 and 20 respectively at which first and second reference potentials are applied. Buffer 22 is responsive to the output signal of bistable circuit 16 for sourcing and sinking current through pump capacitor 24 the latter of which is coupled between nodes 26 and 28. Node 28 is also coupled to the second inputs of comparators 12 and 14. Diodes 30 and 32 are serially coupled between power supply conductor 34 and output 36 for switching the currents flowing therethrough. Filter capacitor 38 and load 40, or other utilization means, are coupled to output 36.

In the discussion of charge pump 10, the following assumptions are made. Charge pump 10 is considered to be operating in a steady-state mode as represented by the waveforms of FIG. 2 which illustrate an arbitrary energy transfer cycle. Filter capacitor 38 is assumed to be sufficiently large to attenuate the high frequency components of the output signal so that load 40 may be considered as a constant current supply over a small number of cycles.

Table 2.1 summarizes the voltage levels per waveform versus time. The individual voltages are defined in the forthcoming text; each being with respect to ground potential.

TABLE 2.1

| node | symbol | potential (reference FIG. 2) |
|---|---|---|
| input of buffer 22 | $V_{a1}$ | low potential |
|  | $V_{a2}$ | high potential |
| node 28 | $V_{b1}$ | first reference potential (close to ground) |
|  | $V_{b2}$ | $2 * V_{CC} - V_{32} - V_{30} - V_{36}$ |
|  | $V_{b3}$ | $V_{36} - \Delta V_{36} + V_{32} - V_{CC} + V_{30}$ |
|  | $V_{b4}$ | second reference potential (close to $V_{CC}$) |
| node 26 | $V_{c1}$ | $V_{CC} - V_{30}$ |
|  | $V_{c2}$ | $V_{36} - \Delta V_{36} + V_{32}$ |
|  | $V_{c3}$ | $V_{36} + V_{32}$ |
| output 36 | $V_{d1}$ | $V_{36} - \Delta V_{36}$ |
|  | $V_{d2}$ | $V_{36}$ |

Figure 2A:
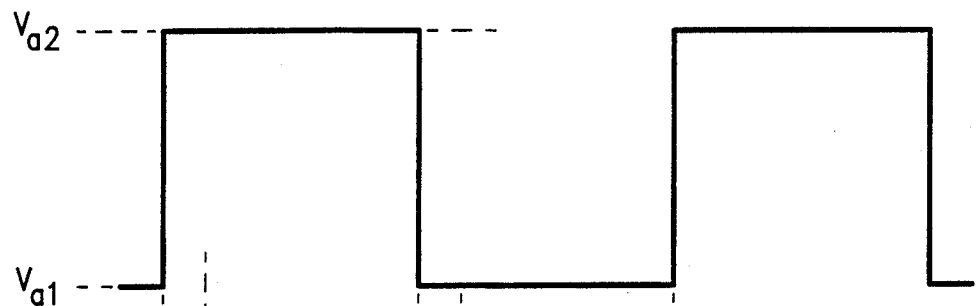
FIGS. 2A-2D are a drawing of waveforms which are useful in the description of the invention.
Figure 2B:
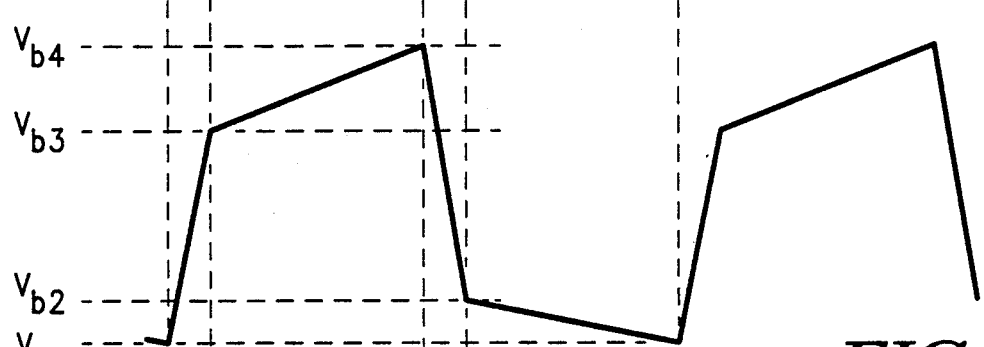
Figure 2C:
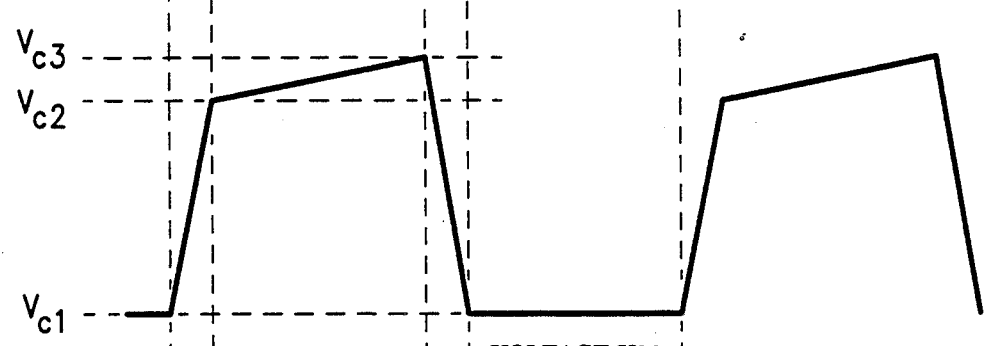
Figure 2D:
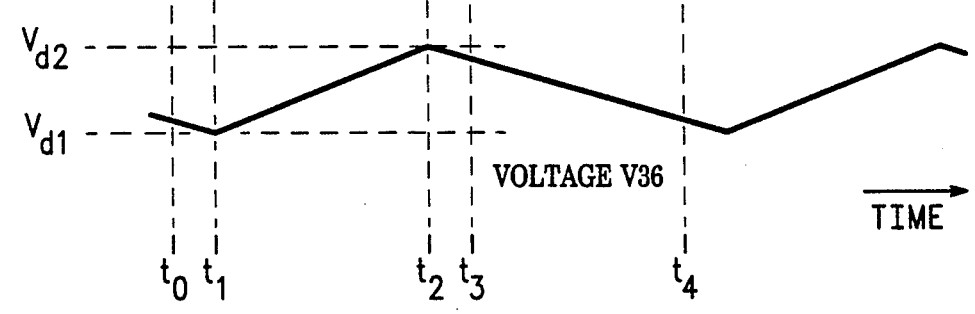

A representative energy transfer cycle of charge pump 10 includes a charge phase and a discharge phase relative to pump capacitor 24 encompassing time $t_0$ through time $t_4$. Beginning at time $t_0$, the input signal of buffer 22, as shown in FIG. 2a, transitions from a low state ($V_{a1}$) to a high state ($V_{a2}$) marking the start of the discharge phase. In FIG. 2b, the dynamic voltage at node 28 ($V_{28}$) simultaneously begins to rise having previously been reduced to a value close to ground potential ($V_{b1}$). The voltage at node 26 ($V_{26}$), in FIG. 2c, increases from its minimum value $V_{CC}-V_{30}$ ($V_{c1}$), where $V_{CC}$ is the voltage applied at power supply conductor 34 and $V_{30}$ is the voltage across diode 30 when forward biased. The voltage at output 36 ($V_{36}$), in FIG. 2d, is equal to a particular value $V_{36}-\Delta V_{36}$ ($V_{d1}$) where $V_{36}$ is the maximum output voltage over a given cycle and $\Delta V_{36}$ is the magnitude of the decay of voltage $V_{36}$ during the preceding charge phase. The particular value of $V_{36}$ may vary over a number of cycles as a function of the long term loading conditions; however, in the limit under a no-load condition, the absolute maximum value of charge pump 10 approaches $2*V_{CC}-V_{30}-V_{32}$ where $V_{32}$ is the voltage across forward biased diode 32.

Between times $t_0$ and $t_1$, diodes 30 and 32 are both reverse biased since voltage $V_{26}$ is greater than $V_{CC}-V_{30}$ and less than $V_{36}-\Delta V_{36}+V_{32}$. The output signal of buffer 28 is essentially driving an open circuit allowing the voltages $V_{28}$ and $V_{26}$ to rise concurrently with the input signal thereof until diode 32 becomes forward biased at time $t_1$ when voltages $V_{28}$ and $V_{26}$ have reached respective values $V_{b3}$ and $V_{c2}$ as defined in Table 2.1. Since diode 30 is still reverse biased, buffer 22 sources current $I_{32}$ through the isolated conduction path of pump capacitor 24 and diode 32 into filter capacitor 38 and load 40. Voltages $V_{28}$ and $V_{26}$ continue to increase, but at slower and unequal slew rates primarily due to the difference in capacitances at the respective nodes. From time $t_1$ to time $t_2$, node 26 is loaded by filter capacitor 38 ($C_{38}$) while node 28 is loaded by the effective capacitance ($C_{28}$) of the series combination of filter capacitor 38 and pump capacitor 24 ($C_{24}$), more specifically by the well known equation:

$$C_{28} = C_{24} * C_{38}/(C_{24}+C_{38}) \text{ or;} \qquad (1)$$

$$C_{38} - C_{28} = C_{28} * C_{38}/C_{24} \qquad (2)$$

The rate of change of voltages $V_{28}$ and $V_{26}$, as given by the respective derivatives $dV_{28}/dt$ and $dV_{26}/dt$, are functions of current $I_{32}$, which flows through capacitors 24 and 38, and capacitances $C_{28}$ and $C_{38}$ as follows:

$$dV_{28}/dt = I_{32}/C_{28} \text{ and;} \qquad (3)$$

$$dV_{26}/dt = I_{32}/C_{38} \qquad (4)$$

It can be readily determined from Equation (2) that $C_{38}$ is greater than $C_{28}$ and, correspondingly, from Equations (3) and (4), the slew rate of voltage $V_{28}$ is greater than that of voltage $V_{26}$. The results can be seen in FIG. 2b and 2c.

During the same time period, current $I_{32}$ transfers a portion the energy stored in pump capacitor 24 to filter capacitor 38 thereby increasing voltage $V_{36}$. The magnitude of the voltage increase is equal to the magnitude of the voltage decay, $\Delta V_{36}$, as shown in FIG. 2d. In general, the amount of energy transferred is determined by the initial energy level of filter capacitor 38 at the start of the discharge phase; the lower initial energy level the greater the energy transfer until voltage $V_{36}$ has reached its steady state peak value close to $2*V_{CC}-V_{30}-V_{32}$. For steady state operation, the amount of energy transferred is then equal to the energy consumed by load 40 during the preceding charge phase.

At time $t_2$, the output voltage of buffer 22 and voltage $V_{26}$ approach their respective peak values, $V_{b4}$ and $V_{c3}$, thus, the rate of change of voltage across pump capacitor 24 and, correspondingly, current $I_{32}$ are reduced to near zero. Commencement of the charging phase of the energy transfer cycle occurs at $t_2$ since the transfer of energy is minimal at this time. To sense this important event, dynamic voltage $V_{28}$, which is applied to the second input of comparator 12, is compared to a first reference potential slightly less than $V_{CC}$ that is applied to input 18. As voltage $V_{28}$ exceeds a first predetermined level, namely, the first reference potential ($V_{b4}$), the output of comparator 12 changes state resetting bistable circuit 16 and complementing the input of buffer 16 as shown in FIG. 2a. Note that the duration of the pulse which resets bistable circuit 16 is relative short compared to the period of the charge phase. Voltage $V_{28}$ then follows the decline of the input voltage of buffer 22 immediately unbiasing diode 32 and allowing node 26 to float. Thus, voltages $V_{28}$ and $V_{26}$ fall concurrently with the input voltage of buffer 22 until diode 30 becomes forward biased at time $t_3$ when voltages $V_{28}$ and $V_{26}$ have reduced to respective values $V_{b2}$ and $V_{c1}$, see Table 2.1 and FIG. 2b and 2c. Buffer 22 sinks current $I_{30}$ from power supply conductor 34 through forward biased diode 30 and pump capacitor 24. Voltage $V_{26}$ remains clamped at $V_{CC}-V_{30}$ while $V_{28}$ continues to fall with a slew rate governed by pump capacitor 24 and current $I_{30}$. At time $t_4$, voltage $V_{28}$ approaches its minimum value ($V_{b1}$) again reducing to near zero the rate of change of voltage across pump capacitor 24 and current $I_{30}$. Voltage $V_{28}$ is also compared to a second reference potential, slightly greater than ground potential, applied to the second input of comparator 14. When voltage $V_{28}$ falls below a second predetermined value, namely, the second reference potential, comparator 14 changes state complementing output signal of bistable circuit 16 which completes a single energy transfer cycle.

For transitional cycles, i.e. the start-up sequence, the amount of energy transferred to filter capacitor 38 is typically not equal to the energy drain. When voltage $V_{36}$ is less than its steady state value, the point $t_1$ moves toward the point $t_0$ allocating more time to discharge pump capacitor 24 and, thus, transferring more energy per cycle. Assuming load 40 consumes less energy than is transferred, voltage $V_{36}$ then rises each repetitive cycle, appearing as a stair step when viewed over multiple cycles. Accordingly, voltage $V_{26}$ is also less than its steady state peak value causing $t_3$ to occur closer to $t_2$ again allocating additional recovery time for pump capacitor 24. The aforedescribed scenario is equally true for periods of heavy loading where pump capacitor 24 must work to keep up with the drain on filter capacitor 38. In both cases, the frequency of the energy transfer cycle decreases as the period of the charge and discharge phases increase to maintain the required rate of energy transfer. For the case of a minimal load operating at steady state, the period of the charge and discharge phases becomes very small, approaching zero in the limit of no load. Since no energy is transferred to filter capacitor 38, i.e. $\Delta V_{36}$ is zero, the oscillating frequency of the feedback circuit increases bounded only by the physical rise and fall times thereof. In summary, the feedback circuit, including comparators 12 and 14 as well as bistable circuit 16, adjusts the oscillating drive direction of buffer 22 appropriately in real time to match the energy transfer rate imposed by the dynamic load and the drive current, thus, substantially eliminating timing mismatches and undesirable output voltage fluctuations and increasing the power deliverable to the load.

Figure 3:
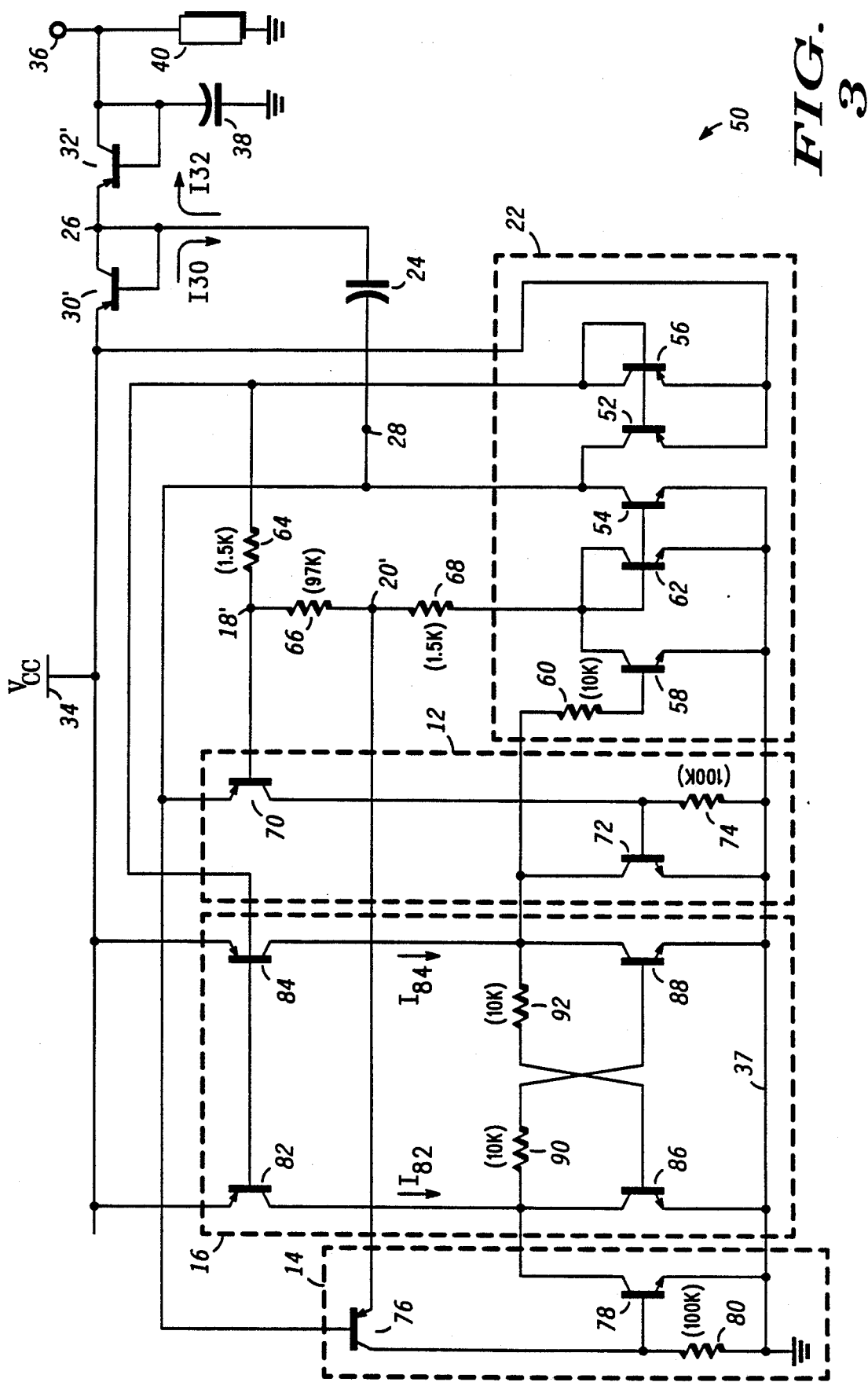
FIG. 3 is a more detailed schematic diagram illustrating the preferred embodiment of FIG. 1.

A detailed schematic diagram of the present invention is illustrated in FIG. 3. Circuit elements having a similar counterpart in FIG. 1 are designated by the same reference number. Typical values are assigned to the resistor and capacitors. Charge pump 50 comprises diode connected transistors 30' and 32' serially coupled between power supply conductor 34 and output 36. The emitter and collector of transistor 30' are coupled to power supply conductor 34 and to the emitter of transistor 32' respectively while the collector of the latter is coupled to output 36. The bases of transistors 30' and 32' are coupled to the corresponding collectors for performing the switching function of diodes 30 and 32 respectively. An external supply voltage, $V_{CC}$, is applied to power supply conductor 34. Filter capacitor 38 and load means 40 are coupled between output 36 and ground potential. Pump capacitor 24 is coupled between nodes 26 and 28 as shown.

The emitter and collector of transistor 52 of buffer 22 are coupled to power supply conductor 34 and to the collector of transistor 54 respectively. The emitter of transistor 54 is coupled to power supply conductor 37. Transistor 56 is configured as a diode having its collector and base shorted together and its emitter coupled to power supply conductor 34 for clamping the base thereof one base-emitter junction potential ($V_{be}$) below $V_{CC}$. The base of transistor 56 is also coupled to the base of transistor 52 maintaining the latter in conduction. The base of transistor 58 is coupled via current limiting resistor 60 to the output of bistable circuit 16 and is responsive to the voltage thereat for turning on and off transistors 54 and 62. The emitter of transistor 58 is coupled to power supply conductor 37. Transistor 62 is also configured as a diode having its collector and base shorted together and its emitter coupled to power supply conductor 37 for clamping the base of transistor 54 one $V_{be}$ above ground potential. When the output voltage of bistable circuit 16 is low, transistor 58 is turned off releasing the bases of transistors 54 and 62 allowing each to turn on driving voltage $V_{28}$ toward ground potential and sinking current $I_{30}$ through transistor 54. Alternately, when the output voltage of bistable circuit 16 is high, the collector of transistor 58 pulls down on the bases of transistors 54 and 62 turning each off. Transistor 52 then sources current $I_{32}$ through pump capacitor 24 raising voltage $V_{28}$ toward $V_{CC}$. Hence, the output state of bistable circuit 16 determines the drive direction of buffer 22.

Resistors 64, 66 and 68 are serially coupled between the bases of transistors 56 and 62 for establishing first and second predetermined reference potentials at node 18' (input 18) and node 20' (input 20). Typically, the values of resistors 64 and 68 are much smaller than the value of resistor 66, as shown in parenthesis. Thus, the potential at node 18' is close to $V_{CC}$, more specifically, $V_{CC}$ minus the combination of the $V_{be}$ of transistor 56 and a small potential across resistor 64. The voltage at node 20' is equal to the small potential across resistor 68 plus either the $V_{be}$ of transistor 62 or the collector-emitter potential of transistor 58 depending on the drive direction of buffer 22, in other words, a value close to ground potential.

Comparator 12 comprises transistors 70 and 72 configured such that the emitter and collector of the former are coupled to node 28 and to the base of the latter respectively. The base of transistor 70 is coupled to node 18', and the emitter of transistor 72 is coupled to power supply conductor 37. Resistor 74 is coupled between the base of transistor 72 and power supply conductor 37. Referring again to FIG. 2b, when voltage $V_{28}$ rises to the first predetermined voltage level one $V_{be}$ above the first reference potential at node 18', transistor 70 turns on sourcing collector current through resistor 74 establishing a base voltage to turn on transistor 72 resetting the output voltage of bistable circuit 16 low. Similarly, comparator 14 comprises transistors 76 and 78 configured such that the base and collector of the former is coupled to node 28 and the base of the latter respectively. The emitter of transistor 76 is coupled to node 20' while the emitter of transistor 78 is coupled to power supply conductor 37. Resistor 80 is coupled between the base of transistor 78 and power supply conductor 37. When the voltage at node 28 falls to a second predetermined voltage level one $V_{be}$ below the second reference potential at node 20', transistor 76 turns on sourcing collector current through resistor 80 establishing a base voltage to turn on transistor 78 setting the output voltage of bistable circuit 16 high.

Bistable circuit 16 includes transistors 82 and 84 operating as current sources each having an emitter coupled to power supply conductor 34 and a base coupled to the base of transistor 56. The collectors of transistors 82 and 84 are coupled to the collectors of transistors 86 and 88 respectively. The bases and collectors of transistors 86 and 88 are crossed-coupled through resistors 92 and 90 respectively. The emitters of transistors 86 and 88 are coupled to power supply conductor 37. The collectors of transistors 86 and 88 are also coupled to the collector of transistor 78 and the output of bistable circuit 16 respectively. At time $t_2$, when voltage $V_{28}$ reaches the first predetermined voltage level exceeding the first reference potential, transistors 70 and 72 turn on pulling the base of transistor 86 low allowing the collector of the latter to rise biasing transistor 88 on. Current $I_{84}$ flows through the collect-emitter conduction path of transistor 88 while current $I_{82}$ flows through current limiting resistor 90 into the base of the same latching the transistor in the conducting state. The output voltage of bistable circuit 16 then switches low, as shown in FIG. 2a, decreasing voltage $V_{28}$ and turning off transistors 70 and 72. At time $t_4$, when voltage $V_{28}$ reaches the second predetermined voltage level, transistors 76 and 78 turn on pulling the base of transistor 88 low allowing the collector of the latter to rise biasing transistor 86. Current $I_{82}$ flows through the collector-emitter conduction path of transistor 86 while current $I_{84}$ flows through current limiting resistor 92 into the base of the same latching the transistor on. The output voltage of bistable circuit 16 then switches high completing the cycle.

Figure 4:
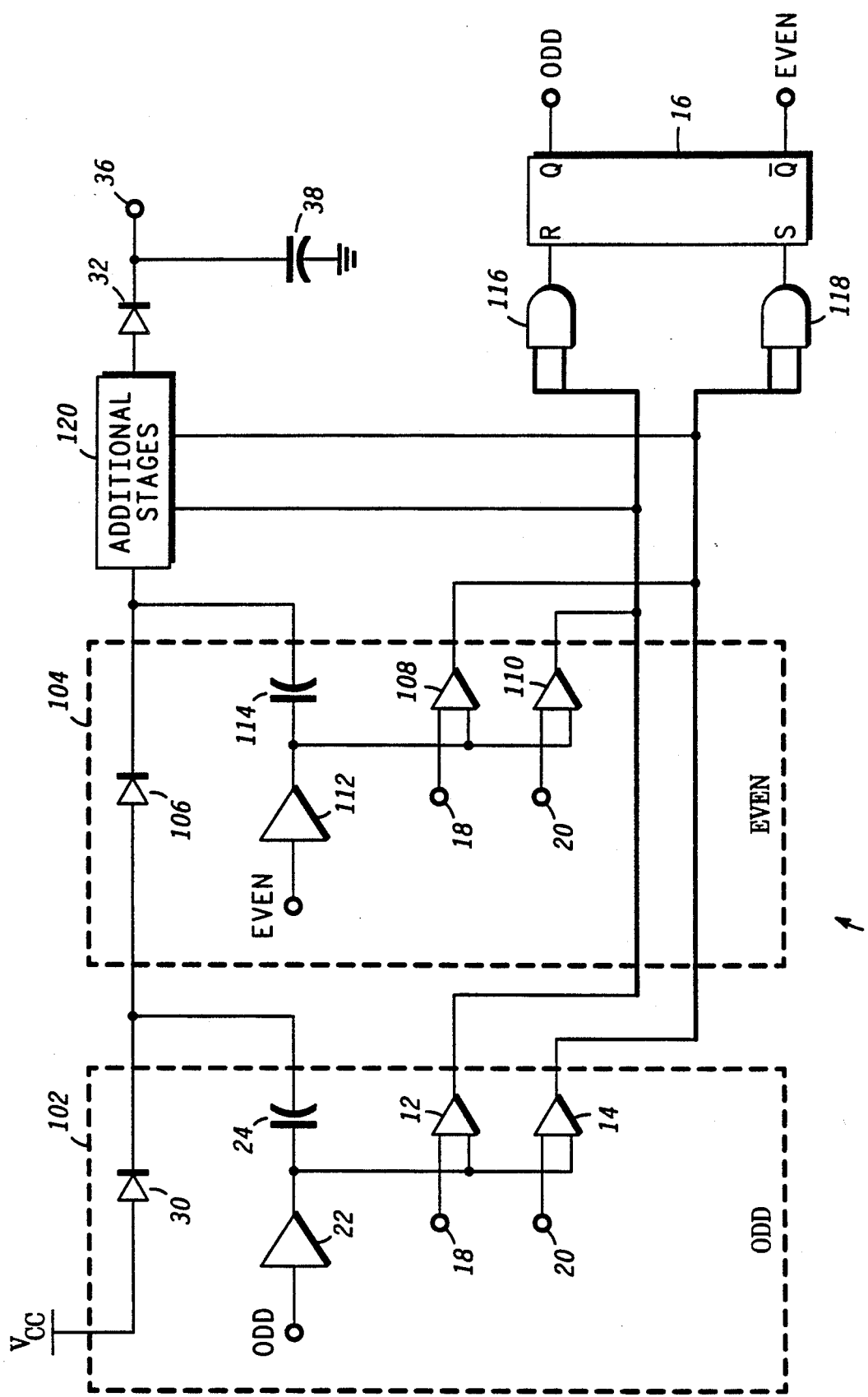
FIG. 4 is a simplified schematic and block diagram illustrating the preferred embodiment with multiple pump stages.

Although the aforedescribed charge pump discloses a voltage doubler implementation, the present invention may achieve greater output voltages by cascading individual pump stages. For example, as shown in FIG. 4, charge pump 100 comprises pump stages 102 and 104. Pump stage 102 comprises comparators 12 and 14, buffer 22, pump capacitor 24 and diode 30 each coupled in aforedescribed manner of FIG. 1. First and second reference potentials are applied to inputs 18 and 20 respectively. A second pump stage 104 is coupled to pump stage 102 and includes diode 106, comparators 108 and 110, buffer 112 and pump capacitor 114 each having a similar function and interconnection as their counterpart in pump stage 102. Additional pump stages 120 substantially similar to the aforementioned may be coupled to pump stage 104 as necessary to achieve the desired output voltage. Diode 32 is coupled between the last pump stage and output 36. Filter capacitor 38 is also coupled to output 36. Multiple-input AND circuits 116 and 118 are coupled between the comparators of each respective pump stage and the input of bistable circuit 16. The output of the first-reference-comparator for each odd pump stage (i.e. comparator 12 for pump stage 102) is coupled to one input of AND circuit 116. The output of the second-reference-comparator for each odd pump stage (i.e. comparator 14 for pump stage 102) is coupled to one input of AND circuit 118. Correspondingly, the output of the first-reference-comparator for each even pump stage (i.e. comparator 108 for pump stage 104) is coupled to one input of AND circuit 118 while the output of the second-reference-comparator for each even pump stage (i.e. comparator 110 for pump stage 104) is coupled to one input of AND circuit 116. The realization of bistable circuit 16 follows the discussion of FIG. 3 wherein the ODD output is coupled to the collector of transistor 88 and the EVEN output is coupled to the collector of transistor 86. The ODD output of bistable circuit 16 is coupled to the input of the buffer of each odd pump stage, and the EVEN output is coupled to the input of the buffer of each even pump stage. The presence of pump stage 104 provides a maximum voltage $V_{36}$ of three times $V_{CC}$ minus the potentials across diodes 30, 106 and 32. In general, the maximum voltage $V_{36}$ is equal to $N*V_{CC}-(N+1)* V_{diode}$ where N is the number of pump stages and $V_{diode}$ is a typical voltage across one of the series coupled diodes.

Hence, what has been described is a novel charge pump including a feedback circuit for alternating the drive direction of a buffer upon sensing first and second predetermined thresholds of the output signal thereof signifying the completion of the charge and discharge phases substantially eliminating the timing mismatches between the period of the oscillating feedback circuit and the charging rate of the pump capacitor.

I claim:

1. A charge pump including first and second switching means serially coupled between a first source of operating potential and an output terminal; first capacitive means having first and second terminals the latter being coupled between the first and second switching means; and a buffer having an input and an output coupled to the first terminal of the first capacitive means at which a dynamic signal is developed; wherein the improvement comprises a feedback circuit coupled between the input and output of the buffer for alternating the drive direction thereof in response to first and second predetermined levels of the dynamic signal.

2. The charge pump of claim 1 further comprising a second capacitive means coupled between the output terminal and a second source of operating potential.

3. The charge pump of claim 1 wherein said feedback circuit comprises:

first comparing means having first and second inputs and an output, said first input being coupled to a first reference terminal at which a first reference potential is applied, said second input being coupled to the output of the buffer;

second comparing means having first and second inputs and an output, said first input being coupled to a second reference terminal at which a second reference potential is applied, said second input being coupled to the output of the buffer; and a bistable circuit coupled between said outputs of said first and second comparing means and the input of the buffer circuit.

4. The charge pump of claim 3 wherein said first comparing means comprises:
a first transistor having a base, an emitter and a collector, said base of said first transistor being coupled to said first input of said first comparing means, said emitter of said first transistor being coupled to said second input of said first comparing means;
a second transistor having a base, an emitter and a collector, said base of said second transistor being coupled to said collector of said first transistor, said emitter of said second transistor being coupled to said second source of operating potential, said collector of said second transistor being coupled to said output of said first comparing means; and
a first resistor coupled between said base of said second transistor and said second source of operating potential.

5. The charge pump of claim 4 wherein said second comparing means comprises:
a third transistor having a base, an emitter and a collector, said emitter of said third transistor being coupled to said first input of said second comparing means, said base of said third transistor being coupled to said second input of said second comparing means;
a fourth transistor having a base, an emitter and a collector, said base of said fourth transistor being coupled to said collector of said third transistor, said emitter of said fourth transistor being coupled to said second source of operating potential, said collector of said fourth transistor being coupled to said output of said second comparing means; and
a second resistor coupled between said base of said fourth transistor and said second source of operating potential.

6. The charge pump of claim 5 wherein said bistable circuit having first and second inputs and an output coupled to the input of the buffer, including:
fifth and sixth transistors each having a base, an emitter and a collector, said emitters of said fifth and sixth transistors being coupled together to said first source of operating potential, said collector of said sixth transistor being coupled to said output of said bistable circuit;
a seventh transistor having a base, an emitter and a collector, said collector of said seventh transistor being coupled to said collector of said fifth transistor and to the first input of said bistable circuit;
an eighth transistor having a base, an emitter and a collector, said collector of said eighth transistor being coupled to said collector of said sixth transistor and to said second input of said bistable circuit, said emitters of said seventh and eighth transistors being coupled together to said second source of operating potential;
a third resistor coupled between said collector of said seventh transistor and said base of said eighth transistor; and
a fourth resistor coupled between said collector of said eighth transistor and said base of said seventh transistor.

7. The charge pump of claim 6 wherein the buffer circuit comprises:
ninth and tenth transistors each having a base, an emitter and a collector, said emitters of said ninth and tenth transistors being coupled together to said first source of operating potential, said bases of said ninth and tenth transistors being coupled together to said bases of said fifth and sixth transistors, said collector and base of said ninth transistor being coupled together, said collector of said tenth transistor being coupled to the output of the buffer circuit;
an eleventh transistor having a base, an emitter and a collector, said collector of said eleventh transistor being coupled to the output of the buffer circuit;
a twelfth transistor having a base, an emitter and a collector, said collector and base of said twelfth transistor being coupled together, said emitters of said eleventh and twelfth transistors being coupled together to said second source of operating potential;
a thirteenth transistor having a base, an emitter and a collector, said collector of said thirteenth transistor being coupled to said bases of said eleventh and twelfth transistors, said emitter of said thirteenth transistor being coupled to said second source of operating potential; and
a fifth resistor being coupled between the input of the buffer and said base of said thirteenth transistor.

8. The charge pump of claim 7 wherein said first switching means includes a fourteenth transistor having a base, an emitter and a collector, said emitter being coupled to said first source of operating potential, said base and collector being coupled together.

9. The charge pump of claim 8 wherein said second switching means includes a fifteenth transistor having a base, an emitter and a collector, said emitter being coupled to said collector of said fourteenth transistor, said base and collector being coupled together to the output terminal.

10. The charge pump of claim 9 further including:
a sixth resistor coupled between said base of said ninth transistor and said first reference terminal;
a seventh resistor coupled between said first and second reference terminals; and
an eighth resistor coupled between said second reference terminal and said base of said twelfth transistor.

11. A charge pump including a buffer having an input and an output, and a feedback circuit for providing an alternating output signal in response to first and second predetermined levels of a drive signal developed at the output of the buffer, the feedback circuit comprising:
first comparing means having first and second inputs and an output, said first input being coupled to a first reference terminal at which a first reference potential is applied, said second input being coupled to the output of the buffer;
second comparing means having first and second inputs and an output, said first input being coupled to a second reference terminal at which a second reference potential is applied, said second input being coupled to the output of the buffer; and
a bistable circuit coupled to said outputs of said first and second comparing means for providing the alternating output signal which is applied to the input of the buffer.

12. A charge pump including a buffer having an input and an output, and a feedback circuit for providing an alternating output signal in response to first and second predetermined levels of a drive signal developed at the output of the buffer, the feedback circuit comprising:
first comparing means having first and second inputs and an output, said first input being coupled to a first reference terminal at which a first reference potential is applied, said second input being coupled to the output of the buffer, said first comparing means including,
(a) a first transistor having a base, an emitter and a collector, said base of said first transistor being coupled to said first input of said first comparing means, said emitter of said first transistor being coupled to said second input of said first comparing means,
(b) a second transistor having a base, an emitter and a collector, said base of said second transistor being coupled to said collector of said first transistor, said emitter of said second transistor being coupled to a first source of operating potential, said collector of said second transistor being coupled to said output of said first comparing means, and
(c) a first resistor coupled between said base of said second transistor and said first source of operating potential;
second comparing means having first and second inputs and an output, said first input being coupled to a second reference terminal at which a second reference potential is applied, said second input being coupled to the output of the buffer; and
a bistable circuit coupled to said outputs of said first and second comparing means for providing the alternating output signal which is applied to the input of the buffer.

13. The charge pump of claim 12 wherein said second comparing means comprises:
a third transitor having a base, an emitter and a collector, said emitter of said third transistor being coupled to said first input of said second comparing means, said base of said third transistor being coupled to said second input of said second comparing means;
a fourth transistor having a base, an emitter and a collector, said base of said fourth transistor being coupled to said collector of said third transistor, said emitter of said fourth transistor being coupled to said first source of operating potential, said collector of said fourth transistor being coupled to said output of said second comparing means; and
a second resistor coupled between said base of said fourth transistor and said first source of operating potential.

14. The charge pump of claim 13 wherein said bistable circuit having first and second inputs and an output coupled to the input of the buffer, including:
fifth and sixth transistors each having a base, an emitter and a collector, said emitters of said fifth and sixth transistors being coupled together to a second source of operating potential, said collector of said sixth transistor being coupled to said output of said bistable circuit;
a seventh transistor having a base, an emitter and a collector, said collector of said seventh transistor being coupled to said collector of said fifth transistor and to the first input of said bistable circuit;
an eighth transistor having a base, an emitter and a collector, said collector of said eighth transistor being coupled to said collector of said sixth transistor and to said second input of said bistable circuit, said emitters of said seventh and eighth transistors being coupled together to said first source of operating potential;
a third resistor coupled between said collector of said seventh transistor and said base of said eighth transistor; and
a fourth resistor coupled between said collector of said eighth transistor and said base of said seventh transistor.

15. A charge pump comprising:
at least one pump stage having an input and an output, including:
a first switching diode having an anode coupled to the input of the pump stage for receiving a first potential and a cathode coupled to the output of the pump stage;
first capacitive means having first and second terminals, said second terminal of said first capacitive means being coupled to said cathode of said first switching diode;
a buffer having an input and an output coupled to said first terminal of said first capacitive means at which a dynamic signal is developed;
first comparing means having first and second inputs and an output, said first input being coupled to a first reference terminal at which a first reference potential is applied, said second input being coupled to the output of the buffer; and
second comparing means having first and second inputs and an output, said first input being coupled to a second reference terminal at which a second reference potential is applied, said second input being coupled to the output of the buffer; and
a feedback circuit coupled between said outputs of said first and second comparators and said input of said buffer for alternating the drive direction of the latter in response to first and second predetermined levels of the dynamic signal.

16. The charge pump of claim 15 further comprising:
a second switching diode having a cathode and an anode coupled to the last pump stage; and
second capacitive means coupled to said cathode of said second switching diode.

17. The charge pump of claim 16 wherein the feedback circuit includes:
first and second circuits for providing a logical AND function each having at least one input and an output, one input of said first circuit being coupled to said output of said first comparing means, one input of said second circuit being coupled to said output of said second comparing means; and
a bistable circuit coupled between said first and second circuits and said input of said buffer.

18. An integrated charge pump, comprising:
first and second switching means serially coupled between a first source of operating potential and an output terminal;
capacitive means having first and second terminals, said second terminal being coupled between said first and second switching diode;
a buffer having an input and an output coupled to said first terminal of said capacitive means at which a dynamic signal is developed; and
a feedback circuit coupled between said input and output of said buffer for alternating the drive direction thereof in response to first and second predetermined levels of said dynamic signal wherein said capacitive means is alternately charge and discharged.

* * * * *